(12) United States Patent
Jung

(10) Patent No.: US 8,084,290 B2
(45) Date of Patent: Dec. 27, 2011

(54) METHOD FOR FABRICATING CMOS IMAGE SENSOR

(75) Inventor: Chung-Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 83 days.

(21) Appl. No.: 12/636,050

(22) Filed: Dec. 11, 2009

(65) Prior Publication Data

US 2010/0164043 A1    Jul. 1, 2010

(30) Foreign Application Priority Data

Dec. 29, 2008   (KR) .................. 10-2008-0135282

(51) Int. Cl.
*H01L 21/00* (2006.01)
(52) U.S. Cl. ................ 438/73; 438/59; 438/57
(58) Field of Classification Search ............ 438/57, 438/59, 73
See application file for complete search history.

(56) References Cited

U.S. PATENT DOCUMENTS

| 5,396,090 | A | * | 3/1995 | Nakai | ................ 257/233 |
| 5,837,113 | A | * | 11/1998 | Suzuki et al. | ............ 204/420 |
| 6,043,481 | A | * | 3/2000 | Tan et al. | ............... 250/216 |
| 7,144,799 | B2 | * | 12/2006 | Chen et al. | ............. 438/597 |
| 7,264,976 | B2 | * | 9/2007 | Deng et al. | ................ 438/7 |
| 7,384,730 | B2 | * | 6/2008 | Hata et al. | .............. 430/325 |

* cited by examiner

*Primary Examiner* — Luan C Thai
(74) *Attorney, Agent, or Firm* — Sherr & Vaughn, PLLC

(57) ABSTRACT

A method of forming a CMOS image sensor and a CMOS image sensor. A method of forming a CMOS image sensor may include forming a plurality of photodiodes on and/or over a semiconductor substrate at regular intervals, forming an interlayer insulating film on and/or over an entire surface of a semiconductor substrate including photodiodes, coating an organic compound on and/or over an entire surface of an interlayer insulating film, coating photoresist on and/or over an organic compound, subjecting a photoresist to exposure and/or development to form a photoresist pattern which may expose an interlayer insulating film opposite to a photodiode region, selectively etching a portion of an exposed interlayer insulating film using a photoresist pattern as a mask, and/or removing a photoresist pattern.

13 Claims, 2 Drawing Sheets

METHOD FOR FABRICATING CMOS IMAGE SENSOR

Figure 1A:
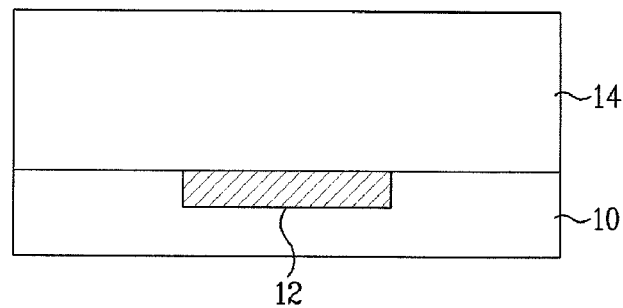

The present application claims priority under 35 U.S.C. 119 to Korean Patent Application No. 10-2008-0135282 (filed on Dec. 29, 2008) which is hereby incorporated by reference in its entirety.

BACKGROUND

Embodiments relate to a method of fabricating a CMOS image sensor and devices thereof. Some embodiments relate to a method of fabricating a CMOS image sensor which may maximize adhesion, for example between an interlayer insulating film and photoresist.

An image sensor may convert an optical image into an electrical signal. An image sensor may be a Charge Coupled Device (CCD) and/or a Complementary Metal Oxide Silicon (CMOS) image sensor. A CCD may have a matrix of photodiodes (PD) which may convert an optical signal into an electrical signal. A CCD may include a plurality of vertical charge coupled devices (VCCD), a horizontal charge coupled device (HCCD) and/or a sense amplifier. A plurality of vertical charge coupled devices (VCCD) arranged between photodiodes in a vertical direction may transmit charges from photodiodes in a vertical direction. A HCCD may transmit charges from a VCCD in a horizontal direction, and/or a sense amplifier may sense charges from a HCCD and/or may forward charges as an electrical signal.

However, a CCD may complicate a fabrication process due to a relatively complicated driving system, a high power consumption and/or multiple photo steps. Moreover, since integration of a control circuit, a signal processing circuit, an analog/digital converter, and the like, on and/or over a charge coupled device chip may be relatively difficult, making a product smaller may be relatively difficult.

Recently, a CMOS image sensor may have been viewed as a next generation image sensor. A CMOS image sensor may be a device which may employ a switching system where MOS transistors may detect outputs from unit pixels in succession, which may be formed on and/or over a semiconductor substrate having substantially the same number as the number of unit pixels. CMOS technology may include a control circuit and/or a signal processing circuit which may be used as peripheral circuits. CMOS image sensor may have a photodiode and/or a MOS transistor within each unit pixel to detect electrical signals from unit pixels in succession, to produce an image. CMOS sensors may have relatively low power consumption owing to CMOS fabricating technology, and/or a relatively simple fabrication process owing to a relatively small number of photo processing steps. Since a control circuit, a signal processing circuit, an analog/digital converting circuit, and the like, may be integrated on and/or over a CMOS image sensor chip, a CMOS image sensor may be relatively smaller. CMOS image sensors may be used in various applications, such as in a digital still camera, digital video camera, and the like.

A CMOS image sensor may be provided with a device isolation film in a semiconductor substrate to define an active region, photodiodes on and/or over a surface of a semiconductor substrate, a plurality of interlayer insulating films and/or metal lines on and/or over an entire surface of a semiconductor substrate, a color filter, and/or microlenses to focus light. Accordingly, there is a need of a CMOS image sensor, and a method of manufacturing an image sensor, which may maximize adhesion, for example between an interlayer insulating film and photoresist.

SUMMARY

Embodiments relate to a CMOS image sensor, and a method of manufacturing an image sensor. According to embodiments, a method of fabricating a CMOS image sensor may maximize adhesion, for example between an interlayer insulating film and photoresist.

According to embodiments, a method of fabricating a CMOS image sensor may include forming a plurality of photodiodes on and/or over a semiconductor substrate, for example at regular intervals. In embodiments, a method of fabricating a CMOS image sensor may include forming an interlayer insulating film on and/or over a surface, which may be an entire surface of a semiconductor substrate including photodiodes. In embodiments, a method of fabricating a CMOS image sensor may include coating an organic compound on and/or over a surface, which may be an entire surface of an interlayer insulating film.

According to embodiments, a method of fabricating a CMOS image sensor may include coating photoresist on and/or over an organic compound. In embodiments, a method of fabricating a CMOS image sensor may include subjecting a photoresist to exposure and/or development to form a photoresist pattern which may expose an interlayer insulating film, for example opposite to a photodiode region. In embodiments, a method of fabricating a CMOS image sensor may include selectively etching a portion of an interlayer insulating film exposed using a photoresist pattern as a mask. In embodiments, a method of fabricating a CMOS image sensor may include removing the photoresist pattern.

DRAWINGS

Example FIG. 1A to FIG. 1D are sectional views illustrating a method of fabricating a CMOS image sensor in accordance with embodiments.

DESCRIPTION

Embodiments relate to a CMOS image sensor, and a method of manufacturing an image sensor. Referring to example FIG. 1A to FIG. 1D, sectional views illustrate a method of fabricating a CMOS image sensor in accordance with embodiments. Referring to FIG. 1A, a semiconductor substrate 10 may include an active region and/or a device isolation. According to embodiments, a device isolation film may be formed at a device isolation region to define an active region. In embodiments, a device isolation film may be formed by a Shallow Trench Isolation process (STI) and/or a Local Oxidation Of Silicon (LOCOS) process, for example.

According to embodiments, a p++ type semiconductor substrate 10 may be subjected to epitaxial growth to form a lightly doped first conduction type, for an example a P− type epitaxial layer. In embodiments, semiconductor substrate 10 may include a single crystalline silicon substrate. In embodiments, formation of an epitaxial layer may lead to form a relatively large and/or deep depletion region on and/or over a photodiode. In embodiments, a capability of a low voltage photodiode which may collect optical charges may be maximized. In embodiments, improving optical sensitivity may be maximiaed.

According to embodiments, impurity ions may be injected relatively lightly on and/or over an active region between a device isolation film, which may form photodiode 12 on and/or over a surface of semiconductor substrate 10. In embodiments, interlayer insulating film 14 may be formed on and/or over semiconductor substrate 10 which may include photodiode 12 and/or a device isolation film. In embodiments, interlayer insulating film 14 may include an oxide film, such as Undoped Silicate Glass (USG). In embodiments, interlayer insulating film may have multiple layers. In embodiments, an interlayer insulating film 14 may include various metal lines, for example form thereover at regular intervals. In embodiments, a light shielding layer may be formed to shield incident light onto portions other than a photodiode.

Figure 1B:
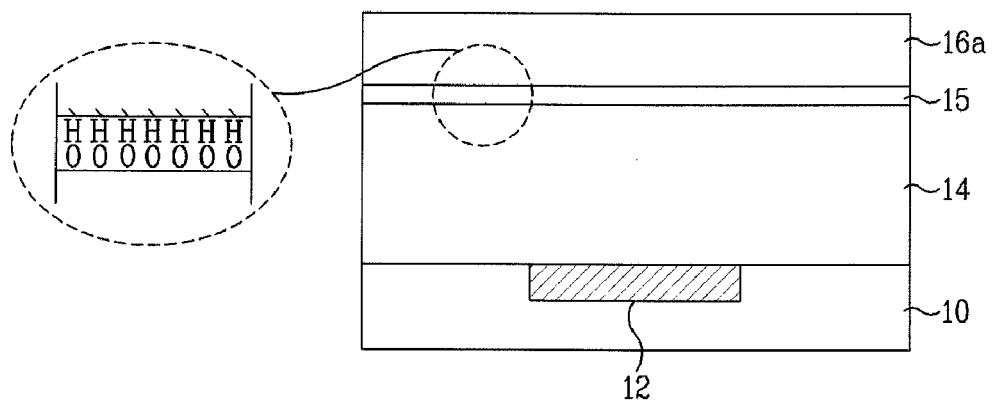

Referring to FIG. 1B, organic substance 15 having an —OH group may be deposited on and/or over a surface, which may be an entire surface of interlayer insulating film 14. In embodiments, organic substance 15 may be deposited by spin coating. In embodiments, organic substance 15 may be subjected to wet etching, for example using a Tetramethylamonium Hydroxide (TMAH) chemical solution to remove a —$C_xH_y$ group, except an —OH group.

According to embodiments, photoresist 16a may be coated on and/or over a surface, which may be an entire surface of interlayer insulating film 14 having an —OH group thereover. In embodiments, an —OH group may react for example with a methyl group in photoresist 16a to form a chemical bond. In embodiments, since an —OH group makes hydrogen bonding which may be distinctive in view of adhesion compared to a covalent bond and/or coordinate bond, adhesion between interlayer insulating film 14 and/or photoresist 16a may be maximized.

According to embodiments, if adhesion between photoresist 16a and interlayer insulating film 14 is relatively poor, a chemical solution can infiltrate into an interface between photoresist 16a and interlayer insulating film 14 and/or may cause an undercut to take place, for example at the time of patterning a pixel region of interlayer insulating film 14 to minimize a gap between a microlens and photodiode 12 in a CMOS fabrication process. In embodiments, hydrogen bonding between an —OH group and photoresist 16a, for example formed by spin coating an organic substance having a —OH group on and/or over interlayer insulating film 14 before coating photoresist 16a on and/or over interlayer insulating film 14, may maximize adhesion. In embodiments, an undercut may be substantially prevented from taking place.

Figure 1C:
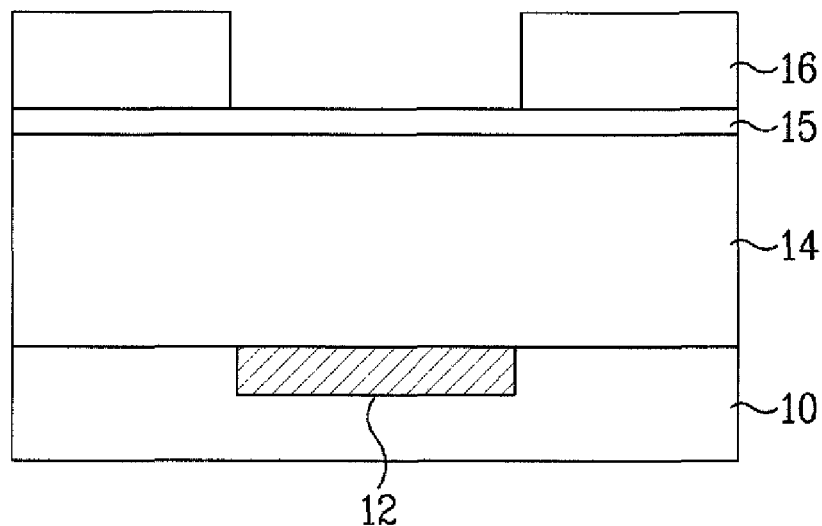
Figure 1D:
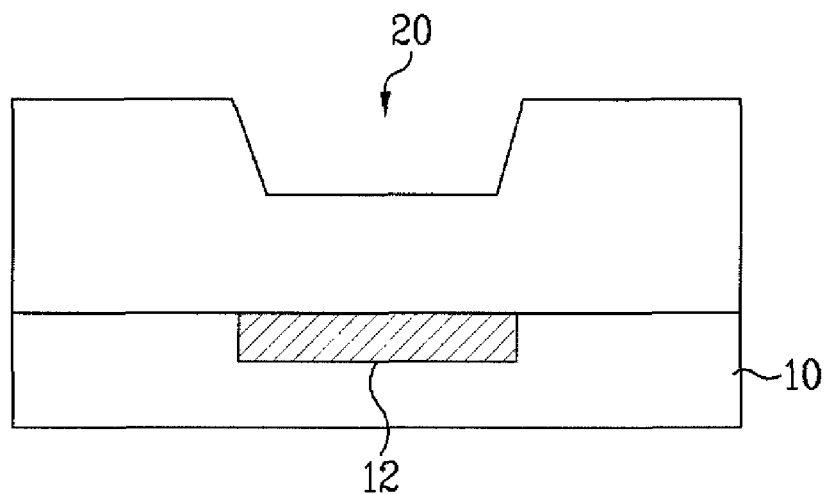

Referring to FIG. 1C, photoresist 16a may be removed from a photodiode region by exposure and/or development. According to embodiments, photoresist pattern 16 may expose interlayer insulating film 14, for example opposite to a photodiode region. Referring to FIG. 1D, exposed interlayer insulating film 14 may be etched selectively, for example by wet etching with BHF, for example $NH_4F$:HF between approximately 1:1 and 1:10, using photoresist pattern 16 as a mask. In embodiments, hole 20 may be formed, for example having a trench shape. According to embodiments, hole 20 may have a depth between approximately 0.5 nm and 1.5 nm. In embodiments, photoresist pattern 16 and/or organic substance 15 may be removed. In embodiments, photoresist pattern 16 and/or organic substance 15 may be removed by a mixed solution of $H_2SO_4$:$H_2O_2$, for example between approximately 2:1 and 10:1, for example after formation of hole 20.

According to embodiments, tangible resist may be coated on and/or over interlayer insulating film 14. In embodiments, tangible resist may be subjected to exposure and/or development to form color filter layers. In embodiments, color filter layers may filter a light by wavebands opposite to photodiodes, for example at regular intervals. In embodiments, a microlens forming material layer may be coated on and/or over a surface, which may be an entire surface of semiconductor substrate 10 including color filter layers. In embodiments, a microlens forming material layer may be subjected to patterning by exposure and/or development to form a microlens pattern on and/or over a color filter layer.

According to embodiments, a method of fabricating a CMOS image sensor may maximize adhesion between an interlayer insulating film and a photoresist. In embodiments, an undercut may be substantially prevented from taking place. In embodiments, efficiency of a CMOS image device may be maximized, for example by reducing a gap between a microlens and a photodiode.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a plurality of photodiodes over a semiconductor substrate;
   forming an interlayer insulating film over a surface of said semiconductor substrate including said plurality of photodiodes;
   coating an organic compound directly on a surface of said interlayer insulating film, wherein said organic compound comprises an organic substance having an —OH group;
   removing a —$C_xH_y$ group from said organic compound;
   coating photoresist over an entire surface of said interlayer insulating film having an —OH group thereover after removing said —$C_xH_y$ group from said organic compound so that said —OH group reacts with a methyl group in said photoresist to form a chemical bond;
   processing said photoresist to form a photoresist pattern exposing at least a portion of said interlayer insulating film opposite to a photodiode region;
   selectively etching a portion of said exposed interlayer insulating film using said photoresist pattern as a mask; and
   removing said photoresist pattern.

2. The method of claim 1, wherein:
   said plurality of photodiodes are formed at regular intervals;
   said interlayer insulating film is formed over an entire surface of said semiconductor substrate; and
   said organic compound is coated over an entire surface of said interlayer insulating film.

3. The method of claim 1, wherein processing said photoresist comprises at least one of exposing and developing.

4. The method of claim 1, wherein coating said organic compound comprises spin coating.

5. The method of claim 1, wherein said removing a —$C_xH_y$ group from said organic compound comprises wet etching said organic compound.

6. The method of claim 5, wherein said wet etching comprises a Tetramethylamonium Hydroxide chemical solution.

7. The method of claim 1, wherein selectively etching said portion of said exposed interlayer insulating film comprises wet etching.

8. The method of claim 7, wherein said wet etching comprises BHF.

9. The method of claim 8, wherein said BHF comprises a ratio of $NH_4F:HF$ between approximately 1:1 and 1:10.

10. The method of claim 1, wherein selectively etching said portion of said exposed interlayer insulating film comprises etching said interlayer insulating film to a depth between approximately 0.5 nm and 1.5 nm.

11. The method of claim 1, wherein removing said photoresist pattern comprises a mixed solution of $H_2SO_4:H_2O_2$.

12. The method of claim 11, wherein said mixed solution of $H_2SO_4:H_2O_2$ comprises a ratio between approximately 2:1 and 10:1.

13. The method of claim 1, comprising forming a CMOS image sensor.

* * * * *